United States Patent
Lehnhardt et al.

(10) Patent No.: US 10,962,583 B2
(45) Date of Patent: Mar. 30, 2021

(54) MONITORING INSULATION FAULTS IN A HIGH-VOLTAGE SYSTEM

(71) Applicant: Volkswagen Aktiengesellschaft, Wolfsburg (DE)

(72) Inventors: Marcus Lehnhardt, Braunschweig (DE); Fabian Albrecht, Dürerstraße (DE); Kay-Michael Günther, Salzgitter (DE); Marcus Sommerfeld, Braunschweig (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 72 days.

(21) Appl. No.: 16/595,240

(22) Filed: Oct. 7, 2019

(65) Prior Publication Data
US 2020/0110125 A1 Apr. 9, 2020

(30) Foreign Application Priority Data
Oct. 8, 2018 (DE) .......................... 102018217116.5

(51) Int. Cl.
*G01R 31/12* (2020.01)
*H02H 1/00* (2006.01)
(Continued)

(52) U.S. Cl.
CPC ....... *G01R 31/1245* (2013.01); *H02H 1/0007* (2013.01); *H02H 7/1213* (2013.01); *H02M 3/04* (2013.01); *H02P 27/06* (2013.01)

(58) Field of Classification Search
CPC .... G01R 31/006; G01R 31/007; G01R 31/02; G01R 31/1245; G01R 31/1272;
(Continued)

(56) References Cited

U.S. PATENT DOCUMENTS 5,818,236 A * 10/1998 Sone .................... B60L 3/0023
324/509
7,554,336 B2 6/2009 Backhaus
(Continued)

FOREIGN PATENT DOCUMENTS

DE 10 141 504 A1 3/2003
DE 10 304 234 A1 8/2004
(Continued)

OTHER PUBLICATIONS

German Office Action from corresponding German Application No. 10 2018 217 116.5, dated Aug. 28, 2019.

*Primary Examiner* — Yusef A Ahmed
(74) *Attorney, Agent, or Firm* — Loza & Loza LLP; Peter Zura

(57) ABSTRACT

A high-voltage system including a high-voltage battery and a DC/DC converter, the high-voltage system having two different galvanically connected voltage levels with enabled DC/DC converters. A first measuring device detects the voltage of the high-voltage battery and a second measuring device detects the voltage at the output of the DC/DC converter. An insulation resistance measuring device may be configured to carry out insulation resistance measurements only when the DC/DC converter is disabled. A third measuring device may detect a voltage between a positive high voltage line and the ground and a fourth measuring device and a voltage between a negative high-voltage line and the ground. An insulation monitoring device may monitor the insulation resistances from data of the first to fourth measuring device at least when the DC/DC converter is enabled.

21 Claims, 1 Drawing Sheet

(51) Int. Cl.
*H02H 7/12* (2006.01)
*H02M 3/04* (2006.01)
*H02P 27/06* (2006.01)

(58) Field of Classification Search
CPC ............ G01R 31/3277; H02H 1/0007; H02H 7/1213; H02M 3/04; H02P 27/06
See application file for complete search history.

(56) References Cited

U.S. PATENT DOCUMENTS

| | | | | |
|---|---|---|---|---|
| 7,560,935 | B2* | 7/2009 | Morimoto | B60L 3/0053 |
| | | | | 324/525 |
| 9,024,769 | B2 | 5/2015 | Hong et al. | |
| 9,244,108 | B2 | 1/2016 | Hausberger et al. | |
| 9,772,392 | B2 | 9/2017 | Deumal Herraiz et al. | |
| 9,891,262 | B2 | 2/2018 | Kullick et al. | |
| 2008/0007277 | A1 | 1/2008 | Backhaus | |
| 2010/0244849 | A1* | 9/2010 | Yano | G01R 31/50 |
| | | | | 324/510 |
| 2010/0244850 | A1* | 9/2010 | Yano | B60L 58/40 |
| | | | | 324/510 |
| 2010/0246081 | A1* | 9/2010 | Yano | B60L 50/51 |
| | | | | 361/91.5 |
| 2013/0147491 | A1* | 6/2013 | Kawamura | G01R 31/50 |
| | | | | 324/509 |
| 2013/0221997 | A1* | 8/2013 | Garcia Alvarrez | G01R 31/14 |
| | | | | 324/709 |
| 2013/0314097 | A1* | 11/2013 | Hausberger | G01R 31/50 |
| | | | | 324/503 |
| 2014/0028322 | A1* | 1/2014 | Tzivanopoulos | H01M 10/48 |
| | | | | 324/433 |
| 2014/0159908 | A1 | 6/2014 | Hong et al. | |
| 2014/0191772 | A1* | 7/2014 | Hetzler | G01R 19/2506 |
| | | | | 324/705 |
| 2014/0333321 | A1* | 11/2014 | Kawamura | G01R 31/52 |
| | | | | 324/509 |
| 2015/0177308 | A1 | 6/2015 | Kullick et al. | |
| 2015/0285851 | A1* | 10/2015 | Kawamura | B60L 3/0069 |
| | | | | 324/509 |
| 2015/0293167 | A1* | 10/2015 | Kawamura | B60L 3/0069 |
| | | | | 324/551 |
| 2016/0096433 | A1* | 4/2016 | Gale | G01R 27/025 |
| | | | | 701/31.9 |
| 2016/0214484 | A1* | 7/2016 | Gale | G01R 31/50 |
| 2017/0225572 | A1* | 8/2017 | Kawanaka | G01R 31/327 |
| 2017/0227589 | A1 | 8/2017 | Kawanaka et al. | |
| 2018/0067158 | A1* | 3/2018 | Kawamura | B60L 3/0046 |
| 2018/0105043 | A1* | 4/2018 | Migita | H02M 7/537 |
| 2018/0136284 | A1* | 5/2018 | Mayer | G01R 31/382 |
| 2019/0047436 | A1* | 2/2019 | Song | G01R 31/50 |
| 2019/0100104 | A1* | 4/2019 | Kawamura | G01R 31/50 |
| 2019/0128943 | A1* | 5/2019 | Kawamura | G01R 31/52 |
| 2019/0187211 | A1* | 6/2019 | Muller | H02J 7/0031 |
| 2019/0310300 | A1* | 10/2019 | Kawamura | G01R 31/086 |
| 2020/0200833 | A1* | 6/2020 | Mayer | G01R 31/389 |

FOREIGN PATENT DOCUMENTS

| | | |
|---|---|---|
| DE | 10 2006 031 663 B3 | 11/2007 |
| DE | 10 2012 222 920 A1 | 6/2014 |
| DE | 10 2013 015 206 B3 | 7/2014 |
| DE | 10 2013 209 142 A1 | 11/2014 |
| DE | 102013226595 A1 | 6/2015 |
| DE | 10 2016 201655 A1 | 9/2016 |
| DE | 10 2015 008 831 A1 | 1/2017 |
| DE | 10 2015 008831 A1 | 1/2017 |
| DE | 10 2016 006 642 A1 | 2/2017 |
| DE | 10 2016 005 732 A1 | 11/2017 |
| DE | 10 2017 009 355 A1 | 4/2018 |
| DE | 10 2016 224 541 A1 | 6/2018 |
| DE | 10 2016 224541 A1 | 6/2018 |
| EP | 2 570 289 A1 | 3/2013 |
| EP | 2 796 887 A1 | 10/2014 |

* cited by examiner

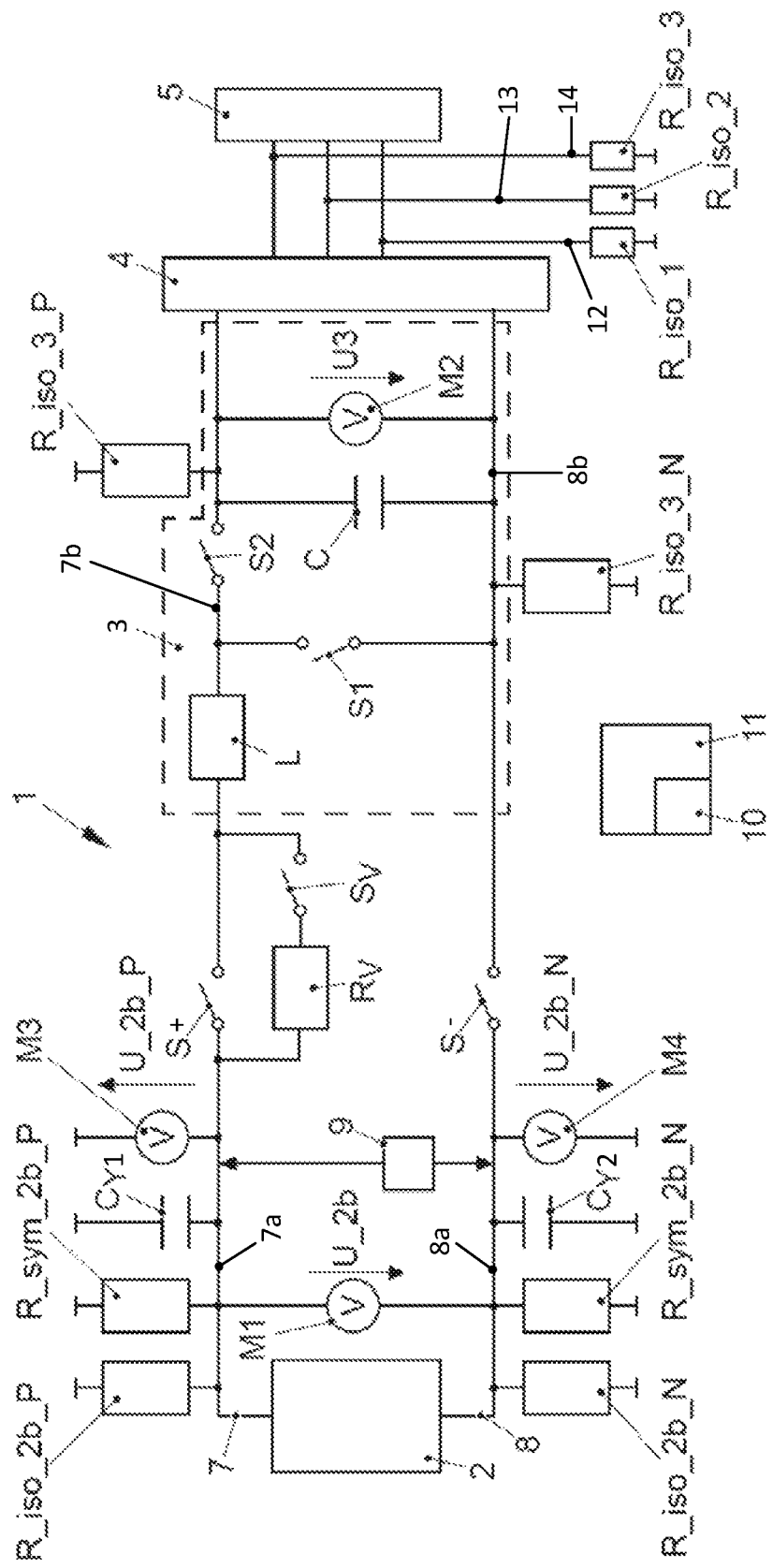

MONITORING INSULATION FAULTS IN A HIGH-VOLTAGE SYSTEM

REFERENCE TO CO-PENDING APPLICATIONS

This patent application claims priority to German patent application DE 10 2018 217 116.5, which was filed on Oct. 8, 2018, the entire disclosure of which is hereby incorporated by reference.

TECHNICAL FIELD

This patent document relates to a high-voltage system, and more particularly to monitoring insulation faults in a high-voltage system.

BACKGROUND

High-voltage systems are usually designed as IT systems and thus are not directly connected to ground. A problem with such systems is that a fault in the insulation on high-voltage lines could result in a short to ground, which could in turn lead to a surge of electrical current that damages other components in the high-voltage system, or damages other components in the equipment in which the high-voltage system is operating. Such a short could even cause a dangerous situation. Accordingly, the insulation used to insulate high-voltage lines is commonly monitored.

A technique for monitoring insulation is to cyclically charge Y capacitors (or $C_Y$ capacitors) and then measure the capacitor's discharge to determine the insulation resistance. The Y capacitors are arranged between each of the high-voltage lines (positive and negative) and ground. The Y capacitors are typically used to conduct RF interference signals to ground, which are often generated by pulse inverters, but they also can be used to evaluate insulation resistance along the high-voltage lines. However, in high-voltage systems with a DC/DC converter where two different galvanically connected voltage levels exist, the Y capacitors cannot be measured during active operation of the DC/DC converter and thus they cannot be used to evaluate the integrity of insulation along the high-voltage lines.

A device is known for monitoring insulation between a low-voltage network and a high-voltage network that are not galvanically isolated from one another. For example, U.S. Pat. No. 9,891,262 discloses a device that can be connected to a low voltage network and then to positive and negative high-voltage connections in a high-voltage network. The device has a plurality of electrical contacts that can be electrically coupled to different sections of the high-voltage network for testing insulation of the section in the circuit to which the electrical contacts are connected.

A problem with known monitoring or testing systems is that they are not capable of monitoring insulation resistance in high-voltage systems having two or more voltage levels that are galvanically isolated from one another.

SUMMARY

In general terms, this patent document relates to a system and method for monitoring high-voltage systems for insulation faults in two or more sections of the high-voltage system that are galvanically isolated from one another and that have different voltage levels.

DESCRIPTION OF THE DRAWINGS

FIG. 1 illustrates a high-voltage system having circuitry for monitoring high-voltage lines for insulation faults.

DETAILED DESCRIPTION

Various embodiments will be described in detail with reference to the drawing. Reference to the drawing and various embodiments in this written specification does not limit the scope of the claims attached hereto. Additionally, any examples set forth in this written specification are not intended to be limiting and merely set forth some of the many possible embodiments for the appended claims.

For purposes of this patent document, the terms "or" and "and" shall mean "and/or" unless stated otherwise or clearly intended otherwise by the context of their use. Whenever appropriate, terms used in the singular also will include the plural and vice versa. Use of the term "a" means "one or more" unless stated otherwise or where the use of "one or more" is clearly inappropriate. Use of the term "or" means "and/or" unless stated otherwise. Use of the terms "comprise," "comprises," "comprising," "include," "includes," "including," "having," and "has" are interchangeable and are not intended to be limiting. For example, the term "including" shall mean "including, but not limited to." The term "such as" also is not intended to be limiting.

All ranges provided herein include the upper and lower values of the range unless explicitly noted. Although values are disclosed herein when disclosing certain exemplary embodiments, other embodiments within the scope of the pending claims can have values other than the specific values disclosed herein or values that are outside the ranges disclosed herein.

Terms such as "substantially" or "about" when used with values or structural elements provide a tolerance that is ordinarily found during testing and production due to variations and inexact tolerances in factors such as materials and equipment. These terms also provide a tolerance for variations due to environmental conditions such as temperature and humidity. Such variations also can be due to normal wear and tear over the life of apparatuses that embody the appended claims.

FIG. 1 shows a high-voltage circuit 1 comprising a high-voltage battery 2 in electrical communication with a DC/DC converter 3. The high-voltage battery has a voltage of about 100 Volts or more. In other example embodiments, the high-voltage battery 2 can have a voltage of about 250 Volts or more, 300 Volts or more, 500 Volts or more, or 1,000 Volts or more. The DC/DC converter 3 is a step-up or boost converter that receives an input signal having a first DC voltage (U_2b), boosts the DC voltage, and then outputs a second, higher DC voltage (U3). In this example embodiment, U3>U_2b. The DC/DC converter 3 has an inductance L, a capacitance C, and two switching elements S1, S2. The switching element S2 is in-line with the high-voltage line 7 and can be switched between open and closed states to disable and enable, respectively, the DC/DC converter 3. The structure and operation of DC/DC converters such as the one illustrated in FIG. 1 are known to those skilled in the art and are not explained herein.

In an alternative embodiments, the DC/DC converter 3 is a step-down converter so that U3<U_2b. A step-down converter in a high-voltage system 1 can be useful for various applications such as operating as a low-voltage regulator for charging the high-voltage battery 2. In alternative embodiments, the DC/DC converter 3 is bi-directional such that it is a step-up converter when current flows in one direction and a step-down converter when current flows in the opposite direction. Additionally, the DC/DC converter 3 can have any suitable circuit other than the circuit illustrated in FIG. 1.

An inverter 4 is in electrical communication between the DC/DC converter 3 and an electric machine 5. The inverter 4 converts the boosted DC signal (U3) output by the DC/DC converter 3 to a three-phase alternating (AC) voltage. Three conductors 12, 13, 14 extend from the inverter 4 to the electric machine 5. Each of the conductors 12, 13, 14 are out of phase with each other by about 60°. In alternative embodiments, the electric machine 5 operates on a single phase AC power. In yet other example embodiments, the electric machine 5 operates on DC power, in which case the high-voltage system 1 may not have an inverter 4. In an example embodiment, the electric machine 5 is a three-phase motor for a vehicle such as an electric or hybrid car. In alternative embodiments, the electric machine 5 is machinery other than an electric car or even machinery other than a vehicle. In other example embodiments, the high-voltage system 1 can be used in different components of the machinery. In automobiles, for example, the high-voltage system can be used in the vehicle's traction network, electric motor controllers, or battery charging system.

Positive and negative high-voltage lines 7,8 extend from the high-voltage battery 2 to the inverter 4. The positive high-voltage line 7 has a first portion 7a extending from the high-voltage battery 2 to a point along the high-voltage line 7 where the voltage steps or increases to a higher level (e.g., from U_2b to U3). The positive high-voltage line 7 has a second portion 7b extending from the point along the high-voltage line 7 where the voltage is boosted to the inverter 4. The negative high-voltage line 8 has a first portion 8a extending from the high-voltage battery 2 to the input of the DC/DC converter 3 and a second portion 8b extending from the input of the DC/DC converter 3 to the inverter 4.

The high-voltage system 1 has at least two contactors S+ and S−, which selectively connect and disconnect the high-voltage battery 2 from the rest of the high-voltage system 1. The positive high-voltage line 7 runs through contactor S+, and negative high-voltage line 8 runs through contactor S−. The contactors S+ and S− galvanically isolate the high-voltage battery 2 from other portions of the high-voltage system 1. A pre-charging resistor Rv and a pre-charging relay Sv are in parallel with contactor S+ and can selectively provide a bypass around the contactor S+ when it is open. The contactors and relays can be any suitable structure including mechanical or semiconductor devices. Additionally, any other galvanic isolators can be used in place of, or in addition to, the contactors S+,S−.

The high-voltage system 1 has a first measuring device M1 which measures the voltage U_2b of the high-voltage battery 2. A second measuring device M2 measures the output voltage U3 of the DC/DC converter 3. A ground can be an electrical connection to earth or to some other conducting body that is large enough to serve in place of earth. A car chassis is an example of a conducting body that is typically large enough to serve in place of earth for the purpose of grounding in vehicles.

A Y-capacitor $C_{Y1}$ is arranged between the positive high-voltage line 7 and ground, and another Y-Capacitor $C_{Y2}$ is arranged between the negative high-voltage line 8 and ground. The Y-capacitors $C_{Y1}$,$C_{Y2}$ suppress interference that otherwise may be on the positive and negative high-voltage lines 7,8, respectively. An insulation resistance R_iso_2b_P exists between the first portion 7a of positive high-voltage line 7 and ground, and an insulation resistance R_iso_2b_p exists between the first portion 8a of negative high-voltage line 8 and ground. In the event that the values of the two insulation resistances R_iso_2b_P and R_iso_2b_p are not identical, discrete balancing resistor R_sym_2b_P may be electrically connected between the first portion 7a of positive high-voltage line 7 and ground, and another discrete balancing resistor R_sym_2b_N may be electrically connected between the first portion 8a of negative high-voltage line 8 and ground. The two parallel circuits provided by the combination of R_iso_2b_P and R_sym_2b_P and the combination of R_iso_2b_N and R_sym_2b_N form substantially identical insulation resistance between the positive and negative high-voltage lines 7,8 and ground. In alternative embodiments, only one of the balancing resistors R_sym_2b_P or R_sym_2b_N may be used to balance the resistance between the high-voltage lines 7,8 and ground.

A third measuring device M3 is arranged to measure the voltage U_2b_P between the first portion 7a of positive high-voltage line 7 and ground. A fourth measuring device M4 is arranged to measure the voltage U_2b_N between the first portion 8a of negative high-voltage line 8 and ground. At the DC/DC converter 3, an insulation resistance R_iso_3_P exists between the second portion 7b of positive high-voltage line 7 and ground, and an insulation resistance R_iso_3_N exists between the second portion 8b of negative high-voltage line 8 and ground. Insulation resistances R_iso_1, R_iso_2, and R_iso_3 are formed between each of the three phase lines 12, 13, 14, respectively, of the electric machine 5 and ground.

The measuring devices M1, M2, M3, and M4 can be voltage sensors that are responsive to voltage and that output a signal or data corresponding to a voltage. In example embodiments, the voltage sensors can have any suitable sensor elements, analog or digital circuitry, integrated circuits, other suitable hardware, or suitable instrumentation for measuring voltage and outputting a signal or data corresponding to the voltage.

The high-voltage system 1 has an insulation resistance measuring device 9 arranged to measure insulation resistance of the first portions 7a, 8a of positive and negative high-voltage lines 7, 8, respectively, when the DC/DC converter 3 is deactivated or disabled. In example embodiments, the insulation resistance measuring device 9 measures insulation resistance by evaluating the discharge behavior of the Y capacitors $C_{Y1}$ and $C_{Y2}$. Other example embodiments measure insulation resistance using any suitable passive or active measuring equipment, instruments, analog or digital circuits, integrated circuits such as microprocessors or other programmable integrated circuits, any other suitable types of hardware, and any suitable methods.

The high-voltage system 1 has an insulation monitoring device 10. In example embodiments, the insulation monitoring device 10 is integrated into a motor control unit 11, which controls the electric machine 5. In other example embodiments, the insulation monitoring unit 10 is integrated into other control units such as a battery control unit, engine control unit, other vehicle control unit, or any other control unit. The insulation monitoring unit 10 also can be separate from the motor control unit 11 and any other control unit. The insulation monitoring device 10, motor control unit 11, and vehicle control unit can be formed with any suitable combination of analog and digital circuits, integrated circuits such as microprocessors or other suitable programmable integrated circuits, or any other suitable types of hardware.

The insulation monitoring device 10 can be in data communication with a display to show results of the insulation resistance measurements. Examples of information that can be displayed include a warning of an existing insulation fault, a warning that insulation is nearing a fault condition, a warning that a high-voltage line 7,8 is grounded, an indication that the DC/DC converter is enabled or disabled, or a value of the measured insulation resistance.

In example embodiments, the insulation monitoring device 10 evaluates the voltages of the four measuring devices M1 (U_2*b*), M2 (U_3), M3 (U_2*b*_P), and M4 (U_2*b*_N) to detect insulation faults during operation of the high-voltage system 1. In example embodiments, the insulation monitoring device 10 or other control unit is programmed to disable the DC/DC converter 3 in the event an existing or imminent insulation fault is detected. In example embodiments, the insulation monitoring device 10 or other control unit in data communication with the insulation monitoring device 10 can control the switching element S2 to open. In other embodiments, the insulation monitoring device 10 or other control unit can open the contactor S+ or open both contactors S+ and S− to disconnect the high-voltage system 1 from the high-voltage battery 2.

When the DC/DC converter 3 is disabled and there are no insulation faults along the high-voltage lines 7,8 then U_2*b*=U_3 and U_2*b*_N=U_2*b*_P. Additionally, U_2*b*_N≤U_2*b* and U_2*b*_P≤U_2*b* and U_2*b*_N+ U_2*b*_P=U_2*b*, which can be shown by active insulation measurement using the insulation resistance measuring device 9 (e.g., by means of $C_Y$ recharging). In other words, the sum of the two voltages across the positive high-voltage line 7 and the ground and the negative high-voltage line 8 and the ground is equal to the voltage of the high-voltage battery 2. None of the voltages are greater than the voltage of the high-voltage battery 2. When the DC/DC converter 3 is enabled, U_3>U_2*b* and U_2*b*_N is defined as:

$$U\_2b\_N = U\_3 \frac{(R\_sym\_2b\_N \| R\_iso\_2b\_p \| R\_iso\_3b\_N)}{(R\_sym\_2b\_N \| R\_is\_2b\_N \| R\_iso\_3b\_N) + (R\_iso3\_P \| AC-part)}$$

where (R_sym_2*b*_N‖R_iso_2*b*_p‖R_iso_3_N) is the equivalent resistance for parallel resistive values of R_sym_2*b*_N, R_iso_2*b*_p, and R_iso_3_N; and (R_iso_3_P‖AC-part) is the equivalent resistance for parallel resistive values of R_iso_3_P and the AC-part, and the AC part is the equivalent resistance of the three insulation resistors R_iso_1, R_iso_2, and R_iso_3.

When a fault occurs in the insulation along the negative high-voltage line 8 causing the line 8 to become grounded, R_iso_2*b*_N or R_iso_3_N will fall to zero. In this situation, an insulation fault resulting in the negative high-voltage line 8 being grounded can be inferred when R_iso_2*b*_N=0, which causes U_2*b*_N=0 V and U_2*b*_P=U_2*b*. However, a threshold value of X can be used to detect the beginning of an insulation fault (e.g., decreasing insulation) before a short to ground occurs. The threshold value X can be selected, whereby an insulation fault in the negative high-voltage line 8 can be inferred when $$U\_2b\_N < \frac{U\_2b}{2} - x$$

where $$U\_2b\_P < \frac{U\_2b}{2} + x$$

and U_2*b*_P≥0. These electrical relationships can be used to infer faults along the entire length of the negative high-voltage line 8 (including first and second portions 8*a*,8*b*), from the high-voltage battery 2, through the DC/DC converter 3, and to the inverter 4.

When a fault occurs in the insulation along the first portion 7*a* of the positive high-voltage line 7 causing the line 7*a* to become grounded, R_iso_2*b*_P will fall to zero. In this situation, U_2*b*_P=0 V and U_2*b*_N=U_2*b*. An insulation fault along the first portion 7*a* of the positive high-voltage line 7 can be inferred before the line 7*a* becomes grounded when $$U\_2b\_P < \frac{U\_2b}{2} - x$$

where $$U\_2b\_N < \frac{U\_2b}{2} + x$$

and U_2*b*_N is ≥0.

When a fault occurs in the insulation along the second portion 7*b* of the positive high-voltage line 7 causing the line 7*b* to become grounded, U_2*b*_N=U_3 and U_2*b*_P=U_2*b*−U_2*b*_N. An insulation fault along the second portion 7*b* of the positive high-voltage line 7 can be inferred before the line 7*b* becomes grounded when U_2*b*_N>U_2*b*+x and U_2B_P<0 applies. The threshold value (X) for detecting an insulation fault of R_iso_3_P does not have to be equal to the X threshold for detecting an insulation fault of R_iso_2*b*_P or R_iso_3_N. Using a threshold value of X to detect a fault before the second part 7*b* of the positive high-voltage line 7 becomes grounded is advantageous because such a short circuit can cause a surge in current. This high-current condition can lead to an overload of the insulation resistance R_iso_2*b*_P along the first part 7*a* of the positive high-voltage line 7, which in turn can lead to an overload of electrical elements in the circuit or an overload of other components in the vehicle or other equipment or machinery in which the high-voltage system 1 is being utilized.

Insulation faults in the AC drive section (e.g., with R_iso_1) can be detected by the third and fourth measuring devices M3, M4 measuring an AC voltage component using the relationships between electrical characteristics as discussed above by substituting the value of R_iso_1, R_iso_2, or R_iso_3 for R_iso_3_P for each of the AC lines.

Additionally, the insulation resistance measuring device 9 can measure the internal insulation resistance of the high-voltage battery 2 by opening the contactors S+ and S−. The total insulation resistance of the high-voltage system 1 can be measured by closing the contactors S+ and S− before the measurement. In addition, the measurement results from the third and fourth measuring devices M3, M4 can be used to check the plausibility of the insulation resistance measurement.

The various embodiments described above are provided by way of illustration only and should not be construed to limit the scope of the claims attached hereto. Those skilled in the art will readily recognize various modifications and changes that may be made without following the example embodiments and applications illustrated and described herein, and without departing from the true spirit and scope of the following claims. It is intended that any such modifications and equivalents be included in the scope of the claims.

The invention claimed is:

1. A high-voltage system comprising:
a high-voltage battery and a DC/DC converter that are configured to operate with two different galvanically connected voltage levels;
a first measuring device for detecting a voltage of the high-voltage battery;
a second measuring device for detecting a voltage at an output of the DC/DC converter;
an insulation resistance measuring device configured to measure insulation resistances only when the DC/DC converter is disabled;
a third measuring device for detecting a voltage between a positive high-voltage line and a ground;
a fourth measuring device for detecting a voltage between a negative high-voltage line and the ground; and
an insulation monitoring device configured to monitor the insulation resistances from data of the first to the fourth measuring devices at least when the DC/DC converter is enabled,
wherein an insulation resistance between the positive high-voltage line and the ground, and an insulation resistance between the negative high-voltage line and the ground are balanced by discrete balancing resistors.

2. The high-voltage system according to claim 1, wherein the insulation resistance between the positive high-voltage line and the ground and the insulation resistance between the negative high-voltage line and the ground are identical.

3. The high-voltage system according to claim 1, wherein the DC/DC converter comprises a step-up converter.

4. The high-voltage system according to claim 1, wherein an inverter and an electric machine are connected to the output of the DC/DC converter, the insulation monitoring device being configured to detect insulation faults of the electric machine as a result of AC voltage components in the data of the third and/or fourth measuring device.

5. The high-voltage system according to claim 1, wherein the insulation monitoring device is configured to detect insulation faults of the positive and negative high-voltage lines between the high voltage battery and the DC/DC converter by the voltage of the fourth or third measuring device being zero and the voltage of the third or fourth measuring device being equal to the voltage of the first measuring device.

6. The high-voltage system according to claim 1, wherein the insulation monitoring device is configured to detect insulation faults between the negative high-voltage line of the DC/DC converter and the ground so that the voltage of the fourth measuring device is zero and the voltage of the first measuring device and the third measuring device are the same.

7. The high-voltage system according to claim 1, wherein the insulation monitoring device is configured to detect insulation faults between the positive high-voltage line of the DC/DC converter and the ground so the voltage of the fourth measuring device is equal to the voltage of the second measuring device and the voltage of the third measuring device is equal to the difference between the voltages of the first measuring device and the fourth measuring device.

8. The high-voltage system according to claim 1, wherein the insulation monitoring device is configured to detect insulation faults between the positive high-voltage line of the DC/DC converter and the ground by the voltage of the fourth measuring device being greater than the sum of the first measuring device and a threshold value and the voltage of the third measuring device being negative.

9. The high-voltage system according to claim 1, wherein the DC/DC converter is configured to be disabled in the event of a detected insulation fault.

10. A method for monitoring insulation faults in a high-voltage system, the high-voltage system having a high-voltage battery and a DC/DC converter that are configured to operate with two different galvanically connected voltage levels, the method comprising:
detecting, at a first measuring device, a voltage of the high-voltage battery;
detecting, at a second measuring device, a voltage at an output of the DC/DC converter;
measuring insulation resistances only when the DC/DC converter is disabled;
detecting at a third measuring device a voltage between a positive high-voltage line and a ground;
detecting at a fourth measuring device a voltage between a negative high-voltage line and the ground;
monitoring the insulation resistances from data of the first to fourth measuring devices at least when the DC/DC converter is enabled; and
balancing an insulation resistance between the positive high-voltage line and the ground, and an insulation resistance between the negative high-voltage line and the ground by discrete balancing resistors.

11. A high-voltage system comprising:
a high-voltage battery;
a DC/DC converter in electrical communication with the high-voltage battery, the DC/DC converter having an enabled state and a disabled state;
first and second galvanic isolators electrically positioned between the high-voltage battery and the DC/DC converter;
a positive high-voltage line in electrical communication from the high-voltage battery and through the DC/DC converter, the positive high-voltage line having first and second portions, the second portion extending through the DC/DC converter, at least part of the second portion having a voltage different than the first portion when the DC/DC converter is enabled, the positive high voltage line having an electrical insulation;
a negative high-voltage line in electrical communication from the high-voltage battery and through the DC/DC converter, the negative high-voltage line having first and second portions, the second portion extending through the DC/DC converter, the negative high-voltage line having an electrical insulation;
an insulation resistance measuring device configured to measure insulation resistances only when the DC/DC converter is disabled;
first, second, third, and fourth voltage sensors, the first voltage sensor configured to measure a first voltage corresponding to a voltage of the high-voltage battery, the second voltage sensor configured to measure a second voltage corresponding to an output of the DC/DC converter, the third voltage sensor configured to measure a third voltage corresponding to the first portion of the positive high-voltage line and a ground, and the fourth voltage sensor configured to measure a fourth voltage corresponding to a voltage between the negative high-voltage line and the ground; and an insulation monitor configured to receive input from the first, second, third, and fourth voltage sensors, the insulation monitor monitoring insulation resistances of the positive and negative high-voltage lines at least when the DC/DC converter is enabled.

12. The high-voltage system of claim 11 wherein the DC/DC converter comprises a step-up converter.

13. The high-voltage system of claim 11 wherein an insulation resistance between the positive high-voltage line and the ground substantially equals an insulation resistance between the negative high-voltage line and the ground.

14. The high-voltage system of claim 13 further comprising at least one balancing resistor between at least one of the positive and/or negative high-voltage lines and the ground, the at least one balancing resistor balancing the insulation resistance of the positive high-voltage line and the insulation resistance of the negative high-voltage line.

15. The high-voltage system of claim 11 wherein the insulation monitor is configured to determine a fault in the electrical insulation along the first portion of the negative high-voltage line when the fourth voltage approaches zero and the third voltage is substantially equal to the first voltage.

16. The high-voltage system of claim 15 wherein the insulation monitor is further configured to determine a fault in the electrical insulation along the second portion of the negative high-voltage line when the fourth voltage approaches zero and the third voltage is substantially equal to the first voltage.

17. The high-voltage system of claim 11 wherein the insulation monitor is configured to determine a fault in the electrical insulation along the first portion of the positive high-voltage line when the third voltage approaches zero and the fourth voltage substantially equals the first voltage.

18. The high-voltage system of claim 11 wherein the insulation monitor is configured to determine a fault in the electrical insulation along the second portion of the positive high-voltage line when the fourth voltage is substantially equal to the second voltage and the third voltage is substantially equal to the first voltage minus the fourth voltage.

19. The high-voltage system of claim 11 wherein the insulation monitor is configured to determine a fault in the electrical insulation along the negative high-voltage line when (i) the fourth voltage is less than half the first voltage minus a threshold value, (ii) the third voltage is less than half the first voltage plus the threshold value, and (iii) the third voltage is greater than or equal to zero.

20. The high-voltage system of claim 11 wherein the insulation monitor is configured to determine a fault in the electrical insulation along the first portion of the positive high-voltage line when (i) the third voltage is less than half the first voltage minus a threshold value, (ii) the fourth voltage is less than half the first voltage plus the threshold value, and (iii) the fourth voltage is greater than or equal to zero.

21. The high-voltage system of claim 11 wherein the insulation monitor is configured to determine a fault in the electrical insulation along the second portion of the positive high-voltage line when the fourth voltage is greater than the first voltage plus a threshold value and the third voltage is negative.

* * * * *